United States Patent [19]

Jassby et al.

[11] 4,065,351
[45] Dec. 27, 1977

[54] PARTICLE BEAM INJECTION SYSTEM

[75] Inventors: Daniel L. Jassby; Russell M. Kulsrud, both of Princeton, N.J.

[73] Assignee: The United States of America as represented by the United States Energy Research and Development Administration, Washington, D.C.

[21] Appl. No.: 670,480

[22] Filed: Mar. 25, 1976

[51] Int. Cl.² .......................... G21B 1/02; H01J 7/14
[52] U.S. Cl. .................................. 176/5; 315/111.7; 176/3
[58] Field of Search .................. 176/1, 3, 4, 5, 9, 2; 315/111.1–111.7

[56] References Cited

U.S. PATENT DOCUMENTS

| | | | |
|---|---|---|---|
| 2,979,635 | 4/1961 | Burleigh | 176/2 |
| 2,997,431 | 8/1961 | Bell et al. | 176/5 |
| 3,343,020 | 9/1967 | Gordon | 176/2 |
| 3,607,627 | 9/1971 | Furth et al. | 176/3 |
| 3,663,361 | 5/1972 | Yoshikawa | 176/3 |
| 3,663,362 | 5/1972 | Stix | 176/2 |
| 3,713,967 | 1/1973 | Hamilton et al. | 176/3 |

OTHER PUBLICATIONS

Scientific American, vol. 227, No. 1 (7/72) Coppi et al., pp. 65–75.
Physics Today (11/75) Kadomtsev et al.
Nuclear Engineering International, N.E.I. (vol. 17, No. 98) pp. 946–949.
Science, vol. 166 (10/17/69), Holcomb, pp. 363–364.
Matt-1050 (8/74) pp. 526–542.
Matt-1087 (1/75) pp. 1–6.
Ornl-4688 (8/71) pp. 44–66.

*Primary Examiner*—Samuel W. Engle
*Assistant Examiner*—S. A. Cangialosi
*Attorney, Agent, or Firm*—Dean E. Carlson; Leonard Belkin; C. Daniel Cornish

[57] ABSTRACT

This invention provides a poloidal divertor for stacking counterstreaming ion beams to provide high intensity colliding beams. To this end, method and apparatus are provided that inject high energy, high velocity, ordered, atomic deuterium and tritium beams into a lower energy, toroidal, thermal equilibrium, neutral, target plasma column that is magnetically confined along an endless magnetic axis in a strong restoring force magnetic field having helical field lines to produce counterstreaming deuteron and triton beams that are received bent, stacked and transported along the endless axis, while a poloidal divertor removes thermal ions and electrons all along the axis to increase the density of the counterstreaming ion beams and the reaction products resulting therefrom. By balancing the stacking and removal, colliding, strong focused particle beams, reaction products and reactions are produced that convert one form of energy into another form of energy.

10 Claims, 5 Drawing Figures

PARTICLE BEAM INJECTION SYSTEM

STATEMENT OF GOVERNMENT INTEREST

This invention was made in the course of or under a contract with the Energy Research and Development Administration, or its predecessor, the United States Atomic Energy Commission.

BACKGROUND OF THE INVENTION

In the field of physics it is desirable to inject high energy particles into a toroidal container to produce colliding beams, and reaction products from reactions that convert one form of energy into another, such reactions being described in "Controlled Thermonuclear Reactions," by Glasstone and Lovberg, 1960, which is incorporated by reference herein, but the systems known heretofore were limited to low density beams, and correspondingly low reaction rates, or they required large and cumbersome apparatus, or were otherwise ineffective, inefficient or troublesome.

SUMMARY OF THE INVENTION

This invention provides a poloidal divertor for stacking counterstreaming ion beams to provide high intensity colliding beams. To this end apparatus and method are provided that injects opposing, neutral, high energy, high velocity, ordered, atomic deuterium and tritium beams into a lower energy, neutral, toroidal, thermal equilibrium, target plasma that is magnetically confined in a vacuum tight toroidal housing along an endless magnetic axis by a strong restoring force magnetic field having helical field lines. The plasma converts the neutral beams into thermal electrons and stacked ions that drift along the helical magnetic field lines as stacked, counterstreaming deuteron and triton beams that collide head-on all along the magnetic axis, while the poloidal divertor removes thermal ions and electrons in equal numbers to balance the injection rate. By confining the plasma in a strong restoring force toroidal magnetic having a poloidal divertor, the counterstreaming ion beams are confined and stacked at high densities for up to 1 or 2 density-confinement times, or more, for producing high reaction rates all along an endless magnetic axis. Moreover, large numbers of useful reaction products are produced all along the toroidal target plasma column, and these products can be removed, captured, or used in a conventional manner.

In one embodiment, this invention provides apparatus and method for injecting high energy, atomic deuterium and tritium beams into a confining magnetic field containing a lower energy, neutral, toroidal, thermal equilibrium target plasma, comprising vacuum container means having an endless first axis, vacuum pump means and entrance and exit port means communicating with the inside of the container means; means for forming a strong restoring force confining magnetic field having helical field lines forming inner and outer concentric magnetic surfaces centered on an extended magnetic second axis concentric with the first axis in the container means; means for forming an equilibrium, thermal, target plasma column of disassociated electrons, tritons and deuterium ions that are confined by the magnetic field in said column in the container means along the endless magnetic axis at an elevated temperature that causes the ions to diffuse by collisions outwardly away from the magnetic axis toward the vacuum container means; means for continuously injecting neutral atomic beams of deuterium and tritium through the entrance ports to produce thermal electrons and counterstreaming deuterons and tritons in the plasma column along the magnetic axis at energies above the energy of the target plasma; the injection forming ordered, high energy, stacked, high velocity, counterstreaming, deuterons and tritons that circulate along the helical field lines with distinct ion velocity distributions that are oppositely displaced in velocity along the magnetic axis while the helical field lines provide strong restoring forces that maintain the directedness of the fast deuterons and tritons along the magnetic axis until they slow down to the average energy of the confined neutral, thermal, target plasma column, thereby to maintain the plasma temperature by stacking the counterstreaming beams for many orbits around the length of the axis at a rate in balance with the diffusion rate; and divertor means communicating with the field lines of the outer magnetic surfaces having vacuum pumping means for collecting diffusing thermal plasma particles through the exit ports and burying them as they diffuse outwardly from the magnetic axis so as to maintain high counterstreaming fast deuteron and triton number densities and balanced thermal diffusion and injections rates.

OBJECTS OF THE INVENTION

It is an object of this invention, therefore, to provide a means and method for injecting neutral atomic beams of tritium and deuterium into a magnetically confined equilibrium target plasma column along trajectories that produce high energy, high velocity, ordered, counterstreaming deuterons and tritons along the magnetic axis at a high energy above the energy of the target plasma column.

BRIEF DESCRIPTION OF THE DRAWINGS

In the drawings, where like elements are referenced alike:

FIG. 3a shows.

DETAILED DESCRIPTION OF THE PREFERRED EMBODIMENT

This invention is useful for converting one form of energy to another. For example, this invention converts neutral atomic beam energy, and/or plasma energy into X-rays and/or neutrons. Thus, this invention is useful for the wide variety of applications to which energy convertors, X-rays and neutron generators have been used heretofore.

Figure 1:
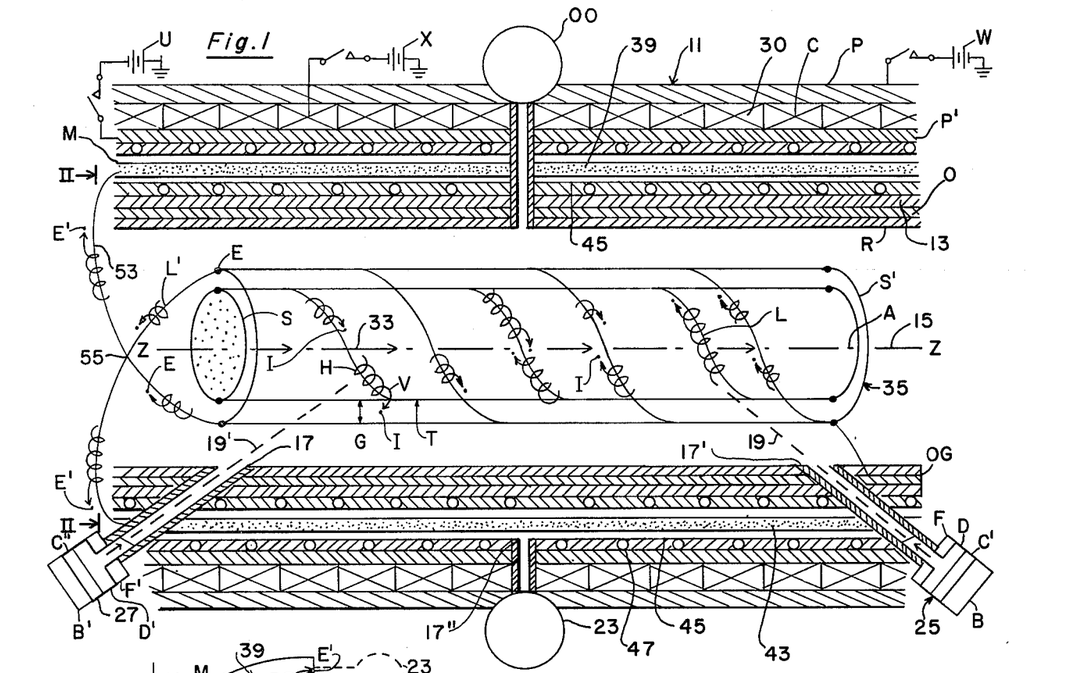
FIG. 1 is a partial cross-section through one embodiment of the strong restoring force system of this invention.
Figure 2:
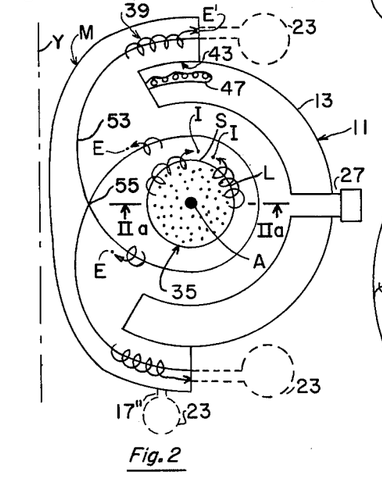
FIG. 2 is a partial cross-section through II — II of the strong restoring force apparatus of FIG. 1.
Figure 2A:
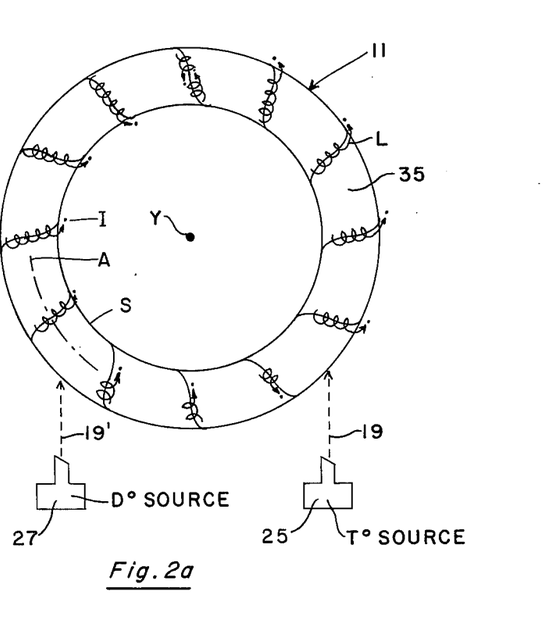
FIG. 2a is a partial cross-section of FIG. 2 through IIa — IIa.

Referring to FIG. 1, there is illustrated a partial cross-section of a typical toroidal plasma confining magnetic field T in a tokamak 11, referred to hereinafter as a strong restoring force tokamak apparatus 11, with the portion cut out of the curve of the torus appearing to be straightened out for ease of explanation. The main components of the apparatus 11, basically, comprise a vacuum tight container housing 13 having a minor radius $a$, a major radius $R''$ an axis of rotation Y, and an endless circular equilibrium axis Z symmetric with the axis of rotation Y (FIG. 2 and FIG. 2a). The container housing 13 has surrounding it toroidal coils C and poloidal P' that are centered on a circular axis 15 concentric with the equilibrium axis Z. When energized from power supplies U and X the coils create a toroidal magnetic field T containing an endless plasma current along magnetic axis A confined in helical field lines L forming concentric magnetic surfaces S and S' centered on the magnetic axis A and concentric with axis 15 in the container housing 13 for the confinement, i.e., confinement of a toroidal plasma column of charged particles in the manner of a magnetic "bottle" having helical equipotential magnetic field lines on each concentric magnetic surface S to provide shear from surface to adjacent surface and strong restoring forces that tie the plasma particles to the magnetic field lines with a diffusion rate that is inversely proportional to the square of the magnetic field strength. As well known in the art, this diffusion rate varies as $1/B^2$, where B denotes the magnetic field strength. This relationship is extremely significant for it shows that if a hot plasma can be confined in a stable way by the helical magnetic field lines, the rate of particle diffusion toward the walls of the housing 13 can be greatly reduced simply by increasing the strength of the magnetic field T. In the apparatus 11 of FIG. 1, which is a tokamak, stability is produced by the plasma current along the equilibrium axis A since it provides a sort of "backbone" that tends to inhibit the development of instabilities. Since the combination of the plasma current and the helical field lines inhibit the growth of instabilities and resemble the helical strong focusing systems known heretofore, the tokamak of FIG. 1 is referred to herein as a strong focusing tokamak. The plasma current is produced by induction in a conventional way by poloidal coils P'.

As also illustrated in FIG. 1, projecting through the sides of housing 13 are two typical entrance ports 17 and 17', and an exit port 17" for a vacuum pump 23. The entrance ports are for two oppositely directed neutral atomic beams 19 and 19' from two neutral beam sources 25 and 27, comprising, basically, deuteron and triton sources B and B', two conventional accelerator sections C' and C", and conventional atomic neutralizing sources D and D', the latter operating by interacting a stream of cesium, water etc. with the accelerated ion beams to produce neutral atoms. Vacuum pumps F and F', which are like the conventional pumps 23 for housing 13, keep unwanted particles from entering the housing 13 from the neutral beam sources 25 and 27. Suitable neutral beam sources are well known in the art, and low energy models have actually been used in the art, one suitable neutral beam source for tritium and deuterium neutral beam sources is described in the cited prior art, which is incorporated by reference herein. Heretofore, however, it has been customary to use single, non-stacked neutral beam pulses.

It has now been discovered that the resulting ion beams can be stacked in strong focused counterstreaming beams to densities 10,000 times the densities of the individual neutral beams 19 and 19'. Moreover, in accordance with the discovery of this invention, these high density beams can be circulated endlessly in the strong focused plasma column up to 10,000 times around the axis of rotation along the magnetic equilibrium axis A by employing a poloidal divertor to extract thermal particles.

In first understanding how the neutral beams result in ion beams, reference is made to the toroidal field T whose direction is shown by arrow 33 in FIG. 1 for purposes of a discussion of one embodiment. The neutral atomic beams 19 and 19' are directed in this embodiment at velocities and energies above the average plasma energy and velocity along parallel paths in one plane (as shown in FIG. 2a) of axis A. Thereupon, the beams enter the lower energy thermal equilibrium target plasma column 35 that is magnetically confined by helical field lines L centered on axis Z in vacuum container housing 13. The beams are directed through the entrance ports 17 and 17' along trajectories that intersect the magnetic axis A, and, since the atomic, neutral, opposite beams are energetic they tend to penetrate the toroidal field T to some depth $G \approx <n_e> a Z_{eff}$ (compare U.S. Pat. No. 3,831,101, which is incorporated by reference herein), where $n_e$ is the electron number density and $Z_{eff}$ is the effective atomic number of the confined plasma. Thereupon, the beams disassociate by collision with the confined plasma in field T to produce equal numbers of thermal electrons and fast ions I that spiral along the helical magnetic field lines in helical paths, as understood in the art, to circulate the ions up to 10,000 times around the axis of rotation Y, before they slow down by drag to the average energy of the neutral target plasma. The ionization rate is given on page 475 of the cited Glasstone et al. reference.

It has now been discovered in accordance with this invention, that the beams can be stacked in the neutral plasma column 35 to densities 10,000 times the densities of the two incoming atomic beams, since the helical field lines provide strong restoring forces that stably confine both the fast ions and the target plasma at the same time until the fast ions slow down to the average energy of the confined plasma. To this end, thermal ions and electrons are removed at a rate that balances their injection rate by a poloidal divertor 39. In this regard, it will be noted in FIG. 1, as well as the remaining FIGURES, that the fast ions I, where they are shown as dots tied to helical field lines L on magnetic surfaces as they enter the toroidal field T, begin to follow helical trajectories along the helical magnetic lines of force L following helical trajectories H as defined by arrows V, with the predominant drift motion of the fast ions being along the field lines.

Upon entering the magnetic field T created by winding C and P', the charged particles are subjected to various forces depending upon the various parameters of the particular system, such as the geometry of the torus, the density of the confined plasma particles, and the drifts of the thermal ions and electrons.

For example, it has been found that in a neutral plasma the thermal plasma particles will tend to drift along the field lines and outwardly across the magnetic lines of force L by diffusion from one magnetic surface to the next adjacent magnetic surfaces in a direction away from the magnetic axis A toward the inside wall of the housing 13. These drifts are directly proportional to the temperature and density of the confined plasma, the strength of confining magnetic field T, the cross-sectional diameter $a$ of the confined plasma column 35, and the rate of the thermal plasma particle removal by poloidal divertor 39. Thus, the drift can be controlled by controlling the various parameters.

In order to follow beams 19 and 19' as they are converted into fast counterstreaming ion beams that circulate around the axis of rotation Y in the strong restoring force toroidal field T in housing 13, or diffusing thermal plasma particles that are scraped off into the divertor 39 and removed to a burial chamber 43 having walls 45 cooled by coils 47 for neutralizing the plasma particles by collision with the walls and removal by pumps 23, FIG'S. 1, 2 and 2a illustrate such circulation or drifts. FIG'S. 1–2a are partial schematic cross-sections taken at 90° from each other in x, y and z planes at right angles to each other, beginning roughly at one of the injection points for the counter-streaming, fast, colliding ion beams.

Beam 19, or more particularly, atomic neutral beam path 19, is shown schematically in partial cross-section (with the curve of the toroidal field T straightened out for ease of explanation) penetrating a given distance G into the toroidal plasma column 35 where the atomic beam disassociates into thermal electrons and an equal number of fast ions above the energy of the neutral thermal target plasma particles, whereupon each fast ion circulates around the axis of rotation Y, since these fast ions are subject to the strong restoring forces of the helical field lines of the toroidal field T that classically confines these fast ions for times at least equal to the average thermal ion confinement time. The penetration for large tokamaks varies $\sim$ as $<n_e> a Z_{eff}$ where $n_e$ = the electron density, $a$ = the minor diameter of the plasma column 35, and $Z_{eff}$ = the effective atomic number of the confined plasma.

During each transit the fast ions tend to slow down by drag until they reach the average energy of the confined thermal target plasma, the different velocities of the fast ions being shown by different length arrows V. Thereupon, the fast ions that slow down to the average thermal velocity of the thermal target plasma particles tend to drift outwardly from an inner concentric surface to an outer concentric surface S until they reach outer surface S' that is bifurcated into separatrices 53 from null point 55. As can be seen from FIG. 1, thermal plasma particles E drift along the field lines L' leading to the null point 55, and then these same particles, shown as E' follow the separatrices into burial chambers 43 where they hit the container walls 45, which are cooled by cooling fluid circulating in coils 47. The walls then neutralize the plasma particles into gas particles that are removed from chambers 43 by vacuum pumps 23, one of which is shown for ease of explanation, out of a line of sight from column 35.

To produce the desired curving separatrices of FIG. 1, a poloidal coil system P having a power supply W is added either outside the ohmic heating coil P' and/or inside thereof to counteract the tendency of the thermal plasma particles to drift toward the wall portion of the housing 13 adjacent the plasma column 35, and then to be recycyled back into the plasma from the container wall along with cool and/or high atomic weight gas particles unduly to cool the plasma column 35 itself. Thus, this invention counters this impurity problem by selectively balancing the thermal plasma diffusion rate and the injection rate with a divertor that removes the diffusing particles away from the outside of the plasma column to remote burial chambers that are not in a line of sight with the plasma column. To this end, the separatrices bend the drifting plasma particle paths in a curve from null points 55 on a ring in the plane of the magnetic axis, A, around the outside of the housing 13, and into horizontal poloidal dead-end chambers 43 above and below the housing 13 for removal by pumps 23. This configuration forms the number "3" in cross-section, with a bulbous lobe at the center of the "3".

The vacuum housing 13, and the divertor burial chambers are made of conventional metal, such as stainless steel and/or ceramics. If container housing 13 is conducting, it has a ceramic insulating gap OG, such as used in the magnetic stellarators known heretofore. The gas source OO for the housing 13 is conventional.

To increase the plasma density, the current in coils C, P and P' may be increased to a desired level. To this end, the coils may be normal resistance or superconducting. In one embodiment, a solenoid 30, referred to in the art as having axial field coils C that are centered on the axis 15 of the vacuum container housing 13, produce axial magnetic field lines L forming concentric magnetic surfaces S centered on an endless z magnetic axis having a particular direction, such as shown by an arrow 33 that coincides with the axis 15 of the vacuum container and the herein described endless plasma current that is produced by coil P'.

As understood in the art, the neutral beams continuously fuel the apparatus 11. To this end, the injection rate balances the rate of diffusion of the drifting particles and the rate of injected particles that are converted from ordered and/or confined ions into other forms of energy. For example, some of the fast ions collide head-on with other counterstreaming ions to produce neutrons that slow down in test material R or shield O to produce heat that is removed by the cooling fluid in coils 47. Likewise, some of the injected ions collide head-on with thermal plasma particles to produce like third particle products that result in heat that is removed via coils 47. Still further, there is a certain probability that the thermal plasma particle collisions will decrease the number of plasma particles by known reactions.

In certain instances, it may be desirable to initially increase the inward penetration of the injected ions as they enter the toroidal magnetic field T.

In such instances the injection trajectory may be adjusted. Likewise, the current in the coils may be adjusted and/or the coil locations may be adjusted, as desired, to pull, distort, or perturb the field lines L of the main toroidal confining field T. For example, the field lines can be adjusted, upwardly at specific locations so that they are generally tangent to the initial trajectory of the particle beams 19 and 19'.

By virtue of this distortion of the toroidal field lines the rate of injection, drift and penetration can be controlled and they are caused to increase at the point of entry into the magnetic field thus "pulling" the particles more rapidly into the toroidal magnetic field while the rate of drift along the magnetic field lines in the unperturbed field remains the same.

Similar field line distortion, which is described in the art as herniation, is described in the art cited and incorporated by reference herein. By such herniation, the drift rate of the particles at the point of injection into the perturbed magnetic field is the highest and decreases to a slower but steadier rate in the unperturbed toroidal field. Moreover, by providing auxiliary magnetic field lines of force forming a poloidal divertor 39 in parallel planes above and below the plane of magnetic axis A, ions can be continuously injected and maintained in the toroidal magnetic field by stacking.

The original toroidal divertor on the C stellarator that was described in U.S. Pat. No. 3,016,341, which is incorporated by reference herein, was conceived, built and successfully operated for the purpose of removing impurities, and, thus, minimizing the resulting energy loss. To this end, the basic principle of the divertor is that, by the use of an outer curved magnetic field line, the thin outer cylindrical shell of magnetic flux, referred to herein as outer magnetic surface S', communicates from the main housing 13 to a remote housing of large surface area and cooling capacity. Charged particles diffusing outwardly from the body of the plasma thus enter the magnetic flux shell and follow the lines of force into the large remote chamber where they strike stainless steel or ceramic solid collector surfaces to which they transfer their energy as heat. In essence, therefore, the toroidal divertors known heretofore surround the main discharge with a protective sheath or scrape-off layer leading to an auxiliary chamber where heat is removed, and where reaction products and impurities are also removed by conventional vacuum pumps. However, the toroidal divertors known heretofore operated locally over only a portion of the plasma column surface, whereas the poloidal divertor shown in FIG'S. 1 and 2 herein operates over the whole distance of the plasma column around the axis of rotation Y. Thus, the number of particles diverted is larger and more uniform around the entire circumference of the plasma column. Moreover, the poloidal divertor permits the injected counterstreaming ion beams to be stacked to a high density comparable to the target plasma density, which may be up to 10,000 times greater than the injected beam densities. To this end also, the described helical field lines provide strong restoring forces on the fast counterstreaming ions to keep them from scattering out of the plasma column before they slow down to the average energy of the equilibrium target plasma column 35. Thus, they make up to 10,000 revolutions around axis Y before slowing down to the average energy of the thermal equilibrium target plasma.

In the partial cross-section of FIG. 1 shown in FIG. 2, which is symmetric around the axis of rotation Y, the poloidal divertor 39 bends the outer field lines of a toroidal magnetic field into a poloidal, bifurcated, dead-end, burial chamber 43 having bifurcated stainless steel and/or refractory and/or getterer coated walls 45 and cooling coils 47 on the bottom of the walls. To this end, a plurality of poloidal divertor coils, such as coils P, which are disposed above and below the endless magnetic axis, are used to form separatrices 53 that extend from a null point 55, which in turn communicates with the outer magnetic field lines L of the outer magnetic surfaces S' that confine the target plasma. The divertor has a fast vacuum pump 23 so that the outer plasma particles tend to be drawn into the burial chamber through the exit ports as they diffuse outwardly, along with any neutral gas atoms produced by charge exchange or reactions between the colliding particles, and these are expelled into the vacuum pump 23. Thus, this invention maintains high neutron producing counterstreaming deuteron and triton number densities up to as high as 50% of the electron number density of the target plasma column. It will also be understood that the divertor 39 also removes neutral atoms, diffusing plasma particles and impurities from the vacuum chamber to prevent recycling of plasma particles from the container walls, thus to help maintain the desired plasma temperature and density.

It happens that there are a number of circumstances that help to reduce the back flow of divered particles. Most of these particles will be released from the collector plates formed by the walls 45 of the divertor 39 in neutral form, and it is possible to remove a large number by pumping. If the rate of removal does not keep pace with the rate of injection and release by diffusion, the back flow of neutral atoms into the main discharge housing 13 is then determined by the pressure attained in the divertor chambers 43 and the gas-kinetic conductance of the poloidal aperture M or opening from these chambers into the main housing 13. The width of this opening (or throat) should be kept as small as possible, within the requirements of the divertor magnetic field, so as to minimize the conductance.

In the operation of one embodiment of this invention, the vacuum container means 13 is evacuated through the exit ports 17" by the vacuum pumping means 23 to about $10^{-8}$Torr, and coils C, P', and P are energized to produce a toroidal magnetic confining field T having helical field lines forming inner and outer concentric magnetic surfaces centered on the magnetic axis concentric with the axis of the vacuum container means. Then a low pressure tritium and deuteron gas is admitted either from a conventional plasma injection means, atom gas injection means, pellet injection means, a low pressure gas source, such as gas source OO, or any other conventional equilibrium target plasma source. In the operation of a gas source OO, the gas is merely released into the vacuum chamber to a low pressure of between $10^{12}$ and $10^{15}$ particles/cm$^3$ and an electrical discharge ionizes the gas for heating to about 1 keV or more by ohmic heating, such as with one or more poloidal coils forming a transformer primary P'. This produces a confined, thermal equilibrium, target plasma column 35 of disassociated electrons, tritons and deuterium ions that are confined in collisional equilibrium with a Maxwellian velocity distribution by the magnetic field in the column in the container 13 along the magnetic axis at an elevated temperature that causes the ions slowly to diffuse outwardly away from the magnetic axis toward the inside vacuum container wall 45, while the plasma column is being confined with a plasma particle number confinement time product $n\Upsilon \geq 10^{12}$sec cm$^{-3}$. By injecting high energy counterstreaming atomic beams of deuterium and tritium through the entrance ports, the atomic beams become ion beams by interaction with the plasma, and these beams form counterstreaming fast ion beams of deuterons and tritons having distinct ion velocity distributions that are oppositely displaced in velocity to collide all along the magnetic axis while the helical field lines provide strong restoring forces that maintain the directedness of the fast ions along the magnetic axis until the fast ions produce neutrons i.e., by collision with each other and the plasma ions, or slow down by collisions in the plasma to the average energy of the plasma column. Thereupon, the divertor 39 selectively removes the thermal ions and electrons and buries them in the burial chambers 43 and vacuum pumps 23 to balance the injection rate and to maintain high colliding ion beam densities. The process of injection, ionization, collision, slowing down, drifting, diffusion, diversion and reaction maintains the plasma temperature, density, and confinement time in balance at a constant rate. Meanwhile, the divertor collection and burial rates, and the vacuum pumping rates through the exit ports remove diffusing plasma particles, impurities and neutral atoms while preventing recycling of the plasma particles from the vacuum container walls into the plasma to maintain the fast ion number density up to as high as 50% of the plasma electron number density.

The following are examples of the above-described embodiments of this invention:

EXAMPLE I

A neutral plasma column of disassociated electrons, tritons and deuterium ions is produced in a thermal equilibrium at a first temperature at a predetermined plasma particle density, volume, average thermal energy and average confinement time along a circular magnetic axis in a vacuum housing containing a toroidal magnetic field having concentric helical magnetic field lines of force forming a strong focusing magnetic container that is concentric with the magnetic axis and capable of confining the predetermined plasma volume at a predetermined density, temperature and average thermal energy for a predetermined period of time at a predetermined thermal ion diffusion loss rate and a predetermined thermal electron diffusion rate. Typical target plasma parameters comprise those in the machines at Princeton U. described in the above-mentioned patents and applications.

Neutral atomic tritium and deuterium beams are continuously injected oppositely to form stacked high density counterstreaming ion beams, while thermal electrons and ions are diverted away from the outside of the plasma column to a remote location by a poloidal divertor that buries these thermal particles there or in a vacuum pump.

EXAMPLE II

The steps of Example I are repeated with a toroidal target plasma column having an electron temperature $T_e \gtrsim 1$ keV; a plasma particle number density $\gtrsim 10^{12}$ particles/cm$^3$; a density confinement time $n\Upsilon \gtrsim 10^{12}$ cm, sec$^{-3}$; a volume $\gtrsim$ the volume in the ATC at Princeton U., which contains a maxwellian plasma weighing $\gtrsim 1$ gram that is confined in a magnetic field $\gtrsim 10$ kG for a time $\gtrsim 10$ m sec with a plasma current $\gtrsim 1$ kA, which determines the helical twist and restoring force on fast ions injected into the plasma and stacked at a high number density 10,000 times the injected beam number densities to circulate the resulting ion beams up to 10,000 times around the axis of rotation.

The atomic beams in this example are equal momentum deuterium and tritium neutral atomic beams having energies $\gtrsim 10$ keV above the average energy of the target plasma, it being noted that the neutron producing cross-section for colliding deuterons and tritons goes up rapidly for colliding beams having energies of over 10 keV. Since the number of neutrons produced depends on the respective colliding beam densities and currents, as well as energies, these densities should be as high as possible. Conventional neutral atomic beam sources that are suitable, are described in the above-mentioned application Ser. No. 411,503 filed 10/31/73, by Dawson et al., which is incorporated by reference herein.

A poloidal divertor carries away the thermal plasma particles from the plasma edge to separate burial chambers outside the plasma column from where almost all of the particles entering the divertor are neutralized by contact with the divertor wall and/or are removed by the vacuum pump attached thereto. Moreover, the "scrape-off" layer of plasma at the discharge edge, lying on the field lines that enter the divertor, serve as a protective shield against residual wall-evolved impurity ions. Advantageously, the out-flowing plasma ionizes the impurity atoms and sweeps them along into the divertor chamber. Likewise, the divertor is used with discharge cleaning, such as is employed on the Alcator device of U.S. Pat. No. 3,778,343 which is at MIT, is incorporated by reference herein, and which confines plasmas having a density of 10 trillion plasma particles at 10 million degrees in magnetic fields of from up to 75,000 gauss to over 100,000 gauss.

EXAMPLE III

The steps of the previous examples are repeated with oppositely directed atomic D and T beams that are injected to stack counterstreaming ions at energies $\gtrsim 10$ keV above the average plasma energy in a neutral plasma column having the respective parameters of the Alcator at MIT, the Ormac at Oak Ridge, or the PDX, PLT or ATC, which are tokamaks at Princeton U. The injected beams have energies of about 20–40 keV or more and equal momenta. The divertor for these devices, which are all poloidal, is one that preserves axisymmetry by operating on the poloidal field component.

EXAMPLE IV

The steps of the previous examples are repeated for a stellarator plasma by injecting the counterstreaming D+ and T+ beams into the C stellerator at Princeton U., which as described in U.S. Pat. Nos. 3,002,912; 2,910,414, and 3,016,341 which are incorporated by reference herein. This stellarator has a toroidal field divertor that has been actually demonstrated experimentally, as described in Princeton PPL Report MATT-Q-21, pp. 7–19 (1963), where the plasma, which was at $\sim 100$ ev temperature and $\sim 10^{13}$ cm$^{-3}$ density, had its impurity level drastically reduced. The non-axisymmetric divertor has the disadvantage of creating a loss cone for energetic ions. Thus, this loss cone due to a toroidal divertor must be minimized by injecting the neutral atomic beams at a place as remote as possible from the divertor such that the distances the resulting counterstreaming ion beams travel before reaching the divertor are maximized.

EXAMPLE V

The steps of the previous examples are repeated in which counterstreaming deuteron and triton beams are stacked at $\gtrsim 1$ mA currents to collide with each other and the target plasma. Here the beams are injected into a neutral equilibrium target plasma that remains neutral during and after injection and that is confined in a strong focusing magnetic means, comprising helical field lines produced by an ohmically induced plasma current of at least 500 kA. The poloidal divertor shown in FIG. 1 removes thermal electrons and ions to increase the density of the stacked counterstreaming ions.

EXAMPLE VI

Figure 3:
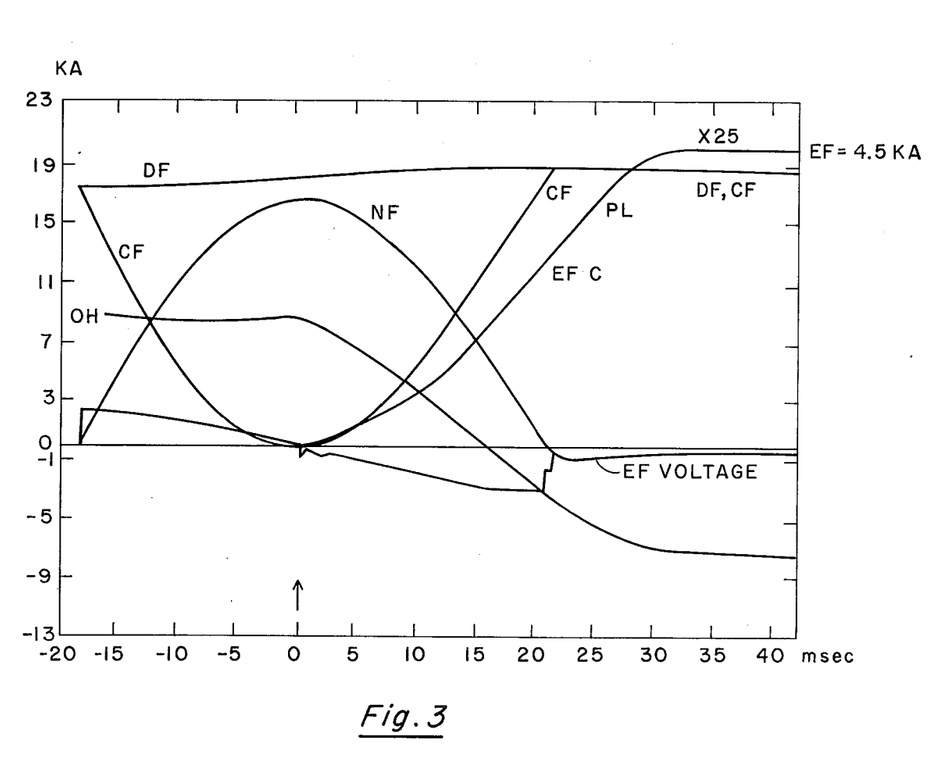
FIG. 3 is a graphic illustration of the currents in the plasma and the coils of Table I, whose location
Figure 3A:
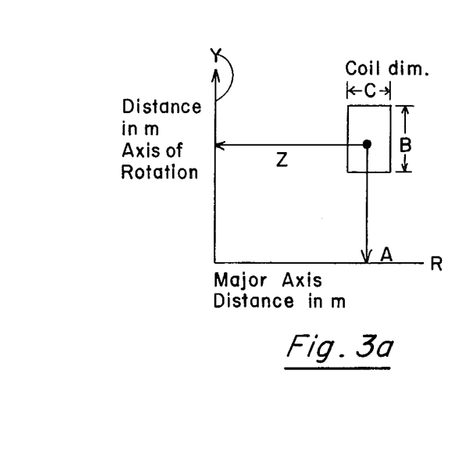

The steps of the previous examples are used using the described injection means, and the toroidal plasma column and poloidal divertor of the PDX at Princeton U., whose coil parameters are described in the attached Tables I and II and Princeton Plasma Physics Report MATT 1159, which is incorporated by reference herein. FIG. 3 shows the currents in the plasma and the tokamak coils.

EXAMPLE VII

The steps of the previous examples are employed using the design described in Princeton U. Report MATT 1165 which is incorporated by reference herein.

EXAMPLE VIII

The steps of the previous examples are repeated using the design described in Tables III – VIII, which are incorporated by reference herein, for pulsed tokamak operation for 0.3 sec atomic beam injection pulses and fast ion slowing down times of at least 10 m sec for materials studies. The plasma current discharge is as long as 50 sec. As least 10 seconds is used to reduce the plasma current, purge the vacuum system and refill, and to bring the plasma current up to the maximum operating value of 1.4 MA.

This invention has the advantage of using conventional equipment for injecting high energy atoms into a toroidal container to produce colliding beams that convert the atoms into other products, such as X-rays or neutrons that can be applied in testing materials, or for transmutations of elements such as actinides, and/or in producing heat. To this end, this invention injects high energy, opposing, atomic beams of deuterium and tritium into a lower energy target plasma column that is magnetically confined by strong focusing means along an endless z magnetic axis. The injection into the plasma produces fast counterstreaming ion beams that are stacked to high number densities by diverting the thermal ions and electrons into a poloidal divertor. The counterstreaming ions make many orbits and transits around the torus up to 10,000 times, and collide head-on with each other around the entire circular orbit of the torus and its magnetic axis at densities up to 10,000 times the injection densities. Reaction products, such as neutrons, are provided all along the magnetic axis by using D-T beams and plasmas, raising the injection energies to more than 10 keV above the plasma temperature, raising the plasma temperature to at least 1 keV, and confining the plasma and injected ions in a strong focusing field, such as is provided by helical field lines or helical stellarator windings with current flowing oppositely in adjacent conductors, whose effect resembles successive stages of Ioffe-type quadrupole magnetic lenses that are rotated 90° from stage to stage. Moreover, like spiral-sector strong focusing magnetic fields, stable orbits for all energies between injection and final exist continually, at least $10^7$ collisions per meter of beam path are possible in the colliding beams, or the limit of Liouvilles theorem does not appear to set in for the fast ions until counter-circulating currents of 10 to 100 amp are established, as described on pages 627 et seq. of "Particle Accelerators," by Livingston and Blewett, McGraw-Hill, 1962, which is incorporated by reference herein. Accordingly, the heretofore known principles of increasing particle energies are surprisingly and synergistically applicable to injected particles that slow down in energy by drag, in accordance with this invention, until they are lost from the torus by scattering, drift and diffusion across the concentric magnetic surfaces, and diversion into the divertor. On the other hand, the slowing-down and diversion process does not violate Liouvilles theorem, because Coulomb slowing-down and angular scattering of the energetic ions removes them from the region of phase space that is occupied by the injected beam, and prevents them from returning to the point of ionization.

TABLE I

INDUCTANCE AND RESISTANCE MATRIX OF CO-AX COIL SYSTEM.
GROUPS = 5
MU = 3

PL = Plasma axis
P - DF = Div. Field Coil
P' { CF = Compr. Field Coil
    { NF = Null Field Coil
    { EF = Equil. Field Coil

MU=1 INCHES
MU=3 METERS 1 2  8 11 13

| NC | A | Z | B R1 | C R2 | T | SYM | RES | FF | TYPE |
|---|---|---|---|---|---|---|---|---|---|
| 1  | 1.45000 | 0.0     | 0.80000 | 0.80000 | 1.000  | 1 | 0.0   | 1.00 | 0 | PL |
| 2  | 0.99000 | 0.57000 | 0.07400 | 0.06000 | 8.000  | 2 | 1.730 | 0.75 | 0 |    |
| 3  | 0.99000 | 0.70000 | 0.07400 | 0.06000 | 8.000  | 2 | 1.730 | 0.75 | 0 |    |
| 4  | 1.19000 | 0.56200 | 0.07400 | 0.06000 | −8.000 | 2 | 1.730 | 0.75 | 0 |    |
| 5  | 1.72000 | 0.56200 | 0.07400 | 0.06000 | −8.000 | 2 | 1.730 | 0.75 | 0 | DF |
| 6  | 1.92000 | 0.54500 | 0.07400 | 0.06000 | 8.000  | 2 | 1.730 | 0.75 | 0 |    |
| 7  | 0.66700 | 0.60000 | 0.07200 | 0.01800 | −3.000 | 2 | 1.730 | 0.75 | 0 |    |
| 8  | 1.93200 | 0.70500 | 0.09200 | 0.01600 | 6.000  | 2 | 1.730 | 0.75 | 0 |    |
| 9  | 0.66500 | 0.07100 | 0.07800 | 0.02200 | −5.000 | 2 | 1.730 | 0.75 | 0 | CF |
| 10 | 2.35300 | 0.28000 | 0.11300 | 0.02800 | −6.000 | 2 | 1.730 | 0.75 | 0 |    |
| 11 | 2.24800 | 0.35000 | 0.05500 | 0.02800 | 1.500  | 2 | 1.730 | 0.75 | 0 |    |
| 12 | 0.66700 | 0.75000 | 0.07200 | 0.01800 | −3.000 | 2 | 1.730 | 0.75 | 0 |    |
| 13 | 0.66700 | 0.14500 | 0.06400 | 0.01800 | −4.000 | 2 | 1.730 | 0.75 | 0 |    |
| 14 | 0.66700 | 0.20900 | 0.06400 | 0.01800 | −4.000 | 2 | 1.730 | 0.75 | 0 |    |
| 15 | 0.66700 | 0.27300 | 0.06400 | 0.01800 | −4.000 | 2 | 1.730 | 0.75 | 0 |    |
| 16 | 0.66700 | 0.33700 | 0.06400 | 0.01800 | −4.000 | 2 | 1.730 | 0.75 | 0 |    |
| 17 | 0.66700 | 0.40100 | 0.06400 | 0.01800 | −4.000 | 2 | 1.730 | 0.75 | 0 | EF |
| 18 | 0.66700 | 0.46500 | 0.06400 | 0.01800 | −4.000 | 2 | 1.730 | 0.75 | 0 |    |
| 19 | 0.66700 | 0.52900 | 0.06400 | 0.01800 | −4.000 | 2 | 1.730 | 0.75 | 0 |    |
| 20 | 1.65000 | 0.60000 | 0.08100 | 0.02900 | 7.000  | 2 | 1.730 | 0.75 | 0 |    |
| 21 | 2.25500 | 0.60000 | 0.20800 | 0.02000 | 13.000 | 2 | 1.730 | 0.75 | 0 |    |
| 22 | 2.25500 | 0.25400 | 0.06100 | 0.04700 | 8.000  | 2 | 1.730 | 0.75 | 0 |    |

1 2  14  20  24

INDUCTANCE MATRIX

TABLE II

| | |
|---|---|
| Major machine radius | 1.4 m |
| *Coil Dimensions | Figure 1 |
| Field at major radius | 25 KG |
| Field at inner leg of coil | 63.75 KG |
| Field at outer leg of coil | 14.41 KG |
| Total NI | 17.5 × 10⁶ ampere turns |
| Number of coils | 20 |
| Number of turns per coil | 20 |
| Current per turn | 43,700 amperes |
| Inductance | .190 henry |
| Inductive energy | 182 megajoules |

TABLE II-continued

| | |
|---|---|
| Resistance | 39.59 milliohm |
| Joule heating | 2.38 Magajoules |
| Pulse repetition rate | 2 min. |
| ESW time | 2.5 secs. |
| Net wt. of copper | 154,000 lbs. |

*Toroidal Field Coils

There are 20 coils, each coil having 20 turns of copper conductor arranged in two layers of ten turns each. The conductor of the inner layers is 3⅜ inches × 1 inch and the outer layer is 4⅜ inches × 1 inch. The silver bearing copper is drawn with a central elliptical hole for a cooling water passage. Each turn is insulated with 0.044 inches of "B" stage crossply material over 0.007 inches of mylar. The insulation is press cured to a dimension of 0.042 inches.

To permit disassembly with the vacuum chamber in place, there are two joints near the top and bottom of each turn of the coil.

TABLE III

Plasma Parameters of the CIT Radiation Facility

| | |
|---|---|
| $R_o$ | 2.8 m |
| $a_p$ | 0.55 m |
| Aspect ratio | 5.1 |
| Elongation (D-shape) | 1.3 |
| $K = \text{circum.}/2\pi a_p$ | 1.40 |
| Midplane wall radius | 0.75 m |
| Wall area | 115 m² |
| $B_t$ on magnetic axis | 40 kG |
| Maximum $B_t$ at NbTi coil | 65 – 70 kG |
| $I_p$ | 1.4 MA |
| q at limiter | 3.0 |
| $n_e$ | $3.9 \times 10^{13}$ cm$^{-3}$ |
| $T_e$ | 4.0 keV |
| $n_e \tau_E$ | $2.1 \times 10^{12}$ cm$^{-3}$s |
| Beam energy | 60 keV |
| $\lambda_s/a_p$ | 0.91 |
| $n_f \tau_h$ | $1.8 \times 10^{13}$ cm$^{-3}$s |
| $\beta_p$ | 3.4 |
| Q (ideal) | 1.32 |
| $P_f$ | 1.06 V/cm³ |
| Injection power | 21 MW |
| Total neutron power | 22 MW |
| Total thermal power | 49 MW |

TABLE IV

CIT Neutron Source Characteristics

| | |
|---|---|
| Neutron intensity[a] | $9.6 \times 10^{18}$ n/s |
| Neutron power | 22 MW |
| Neutron wall loading | 0.19 MW/m² |
| Neutron flux | $8.4 \times 10^{12}$ n/cm²/s |
| Pulse length | ≧ 30 s |
| Annual fluence at 50% plant factor | $1.3 \times 10^{20}$ n/cm² |
| Wall area available for test samples | 30 m² |

[a]All numbers refer to uncollided 14-MeV neutrons.

TABLE V

Neutral Beam Injection Systems

| | |
|---|---|
| Injection energy | 60 keV |
| Injection power | 12.6 MW D° |
| | 8.4 MW T° |
| Injection current | 210 A(equiv.) D° |
| | 140 A(equiv.) T° |
| Number of beam lines | 6 |
| Total beam aperture | 1.75 m² at 0.02 A/cm² |
| Fraction of wall area | 1.5% |
| Overall efficiency | 60% |
| Power consumption | 35 MW(e) |

TABLE VI

Tritium Throughput

| | |
|---|---|
| Throughput at 75% duty factor | 12 g/hr |
| Throughput at 50% plant factor | 69 kg/yr |
| Fractional burn-up per pass | 1.1% |
| Annual consumption at 50% | 760 g/yr |

TABLE VI-continued

Tritium Throughput

| | |
|---|---|
| plant factor | |
| Total inventory | 500 g |
| Reprocess time | 1.5 da |

TABLE VII

Power Consumption

| | |
|---|---|
| Hybrid magnet | 20 MW |
| Beam injectors[a] | 35 MW |
| OH coils (current start-up only) | 26 MW peak |
| OH coils (resistive) | 9 MW |
| EF coils | 21 MW peak |
| Miscellaneous plant | 12 MW |
| Total CIT facility[a] | 97 MW |

[a]Beam injectors are not operated during current start-up.

What is claimed is:

1. Apparatus for injecting charged particles into a confining magnetic field, comprising:

a. vacuum tight housing means having an endless z first circular axis, and entrance ports and exit ports forming solid collecting walls out of the line of sight with the axis but communicating therewith through poloidal apertures in the sides of the housing means;

b. vacuum pump means communicating with the collecting walls;

c. means for forming a confining, toroidal, magnetic field having helical field lines forming inner and outer concentric magnetic surfaces centered on an endless magnetic second axis concentric with the first axis in the housing means;

d. means for forming an equilibrium, neutral, thermal, target plasma column of disassociated electrons, tritons, and deuterium ions that are confined by the magnetic field in the column in the container means along the magnetic second axis at an elevated temperature that causes the ions to diffuse by collisions outwardly away from the magnetic axis toward the vacuum container means;

e. means for continuously injecting neutral atomic beams of deuterium and tritium through the entrance ports along parallel trajectories in the plane of the circular axis at energies above the average energy of the plasma sufficient to penetrate the sides of the plasma column to a depth for producing thermal electrons and deuterons and tritons at energies of at least 10 keV above the average energy of the confined target plasma column, the injection forming fast, ordered, high energy, high velocity counterstreaming deuterons and tritons that drift along the helical field lines, and circulate around the length of the axis, these counterstreaming deuterons and tritons forming beams having distinct ion velocity distributions that are oppositely displaced in velocity along the magnetic axis, while the helical field lines provide strong restoring forces that maintain the directedness of the fast deuterons and tritons along the magnetic axis, some of said fast deuterons and tritons slowing down to the average energy of the confined target plasma column thereby to maintain the plasma density and temperature by balancing the diffusion rate; and f. divertor means communicating with the field lines of the outer magnetic surfaces through the poloidal apertures for collecting diffusing plasma particles through the exit ports from the outside of the plasma column and burying them in the vacuum pump means so as to maintain a high counterstreaming deuteron and triton number density.

2. Method for injecting charges particles into a tokamak confining magnetic field, comprising:

a. Magnetically confining a neutral, toroidal plasma column of ions and electrons having a thermal temperature, density, volume, average thermal energy and average confinement time along an endless magnetic axis in a tokamak vacuum container means containing a toroidal magnetic field having concentric magnetic field lines of force forming a magnetic container that is concentric with the magnetic axis and capable of confining the plasma for a sufficient period of time to produce a thermal ion diffusion loss rate and a thermal electron diffusion loss rate;

b. injecting ordered, neutral, atomic beams having fast ordered ions and orbital electrons at densities that are directed into the confined plasma with trajectories that are generally tangent to the magnetic field lines and azimithally along the magnetic axis in the same and the opposite direction to the direction of the magnetic axis at an energy that is greater than the average thermal energy of the confined plasma, the neutral beams interacting with the confined thermal plasma ions to inject fast ions and thermal electrons into the plasma, the fast ions forming oppositely circulating, counterstreaming ion beams having directed, distinctly ordered, ion velocity distributions and associated beam currents that are oppositely displaced in velocity along the magnetic axis, the latter ion beams injecting thermal ions into the confined plasma due to the slowing down of the ion beams in the confined plasma;

c. the magnetic confinement maintaining the aforesaid thermal electron injection in balance with the thermal electron diffusion to maintain a thermal electron density in the confined plasma;

d. the magnetic confinement of the plasma also maintaining the directedness of the counterstreaming ion beams until the ions therein slow down to the average thermal energy of the confined plasma; and e. removing the diffusing thermal electrons and the ions that slow down to the average thermal energy of the confined plasma, said removal being at least as fast as the average time it takes for the thermal ions to slow down to the average thermal energy of the confined plasma so as to maintain a high counterstreaming ion number density in the counterstreaming ion beams that is at least as great as the confined thermal ion density, said removal also maintaining the sum of the aforesaid counterstreaming ion number density and the confined thermal ion density substantially in balance with the confined electron density in the confined plasma so that the counterstreaming ion beams continuously produce a large number of head-on collisions between the counterstreaming ions all along the magnetic axis.

3. The method of claim 2 in which opposite deuterium and tritium neutral atomic beams are injected into the confining magnetic field to produce counterstreaming deuteron and triton beams that are tied to the magnetic field lines of force along trajectories that spiral helically along axes that are centered on the respective field lines.

4. The method of claim 3 in which the confined plasma has a weight of at least one gram at an electron temperature $T_e \geq 1$ keV and a density $n_e \geq 10^{12} cm^{-3}$.

5. The method of claim 4 in which the removal of the thermal ions is provided by a divertor for selectively decreasing the number of relatively cold ions confined in the magnetic field all along the magnetic axis.

6. The method of claim 5 in which a plasma current is provided along the endless magnetic axis for twisting the field lines into helixes that helically twist around the magnetic axis.

7. The method of claim 6 in which the input and output are balanced to maintain a counterstreaming ion number density that is 50% of the electron number density of the confined plasma.

8. The method of claim 7 in which counterstreaming deuteron and triton beams collide to produce neutrons in the confined plasma along the length of the magnetic axis.

9. The method of injecting charged particles into a confining magnetic field, comprising the steps of evacuating a vacuum container means having an endless equilibrium axis to a vacuum of at least $3 \times 10^{-5}$ torr; forming a magnetic field having concentric magnetic surfaces along a magnetic axis and field lines concentric with the magnetic axis that are co-axial with the equilibrium axis in the vacuum container means; admitting at least one gram of a gas containing tritium and deuterium into the vacuum container means to a density of at least $10^{12}$ particles/cm$^3$, ohmically heating the gas to a temperature of at least 1.0 keV to produce an equilibrium target plasma column containing thermal ions and electrons that are confined at a number density of at least $10^{12}$ particles/cm$^3$ in the magnetic field in the vacuum container means along the magnetic axis for at least 1 msec, injecting high energy, high velocity, ordered neutral atomic deuterium and tritium beams into the target plasma in the same and the opposite direction to the direction of the magnetic axis at energies of at least 10 keV greater than the energy of the confined plasma and at currents of at least $1\mu A$ to produce ordered, high energy, high velocity counterstreaming deuterons and tritons with like high energies and velocities, the counterstreaming deuterons and tritons having number densities higher than the density of the injected beams and distinct ion velocity distributions that are oppositely displaced in velocity along the magnetic axis while the magnetic field maintains the directedness of the counterstreaming deuterons and tritons along the magnetic axis until they slow down to the average energy of the confined equilibrium target plasma column, and diverting thermal electrons and ions away from the outside of the plasma column into a poloidal divertor for burial therein.

10. Method for injecting charged particles into a confining magnetic field, comprising the steps of:

a. producing a thermal plasma column in a vacuum tight housing;

b. confining the plasma along a circular axis in a toroidal magnetic field in the vacuum tight housing;

c. injecting equal momentum, neutral atomic beams through the sides of the housing along parallel trajectories in the plane of the circular axis at energies above the average plasma energy sufficient to penetrate the outside of the plasma column to a depth for producing counterstreaming ion beams that slow down to the average energy of the thermal plasma and drift across the toroidal magnetic field in a direction away from the axis by diffusion;

d. continuing the injection for a period sufficient to stack the counterstreaming beams for many orbits around the length of the axis at a rate in balance with the diffusion rate; and e. removing the thermal plasma particles that drift across the magnetic field by diffusion by magnetically diverting them through poloidal apertures in the sides of the housing selectively to neutralize the particles outside of the plasma column and out of a line of sight therewith for maintaining high counterstreaming ion beam densities.

* * * * *